(12) United States Patent
Kajiwara

(10) Patent No.: US 9,790,596 B1
(45) Date of Patent: Oct. 17, 2017

(54) GAS NOZZLE AND PLASMA DEVICE EMPLOYING SAME

(71) Applicant: KYOCERA Corporation, Kyoto-shi, Kyoto (JP)

(72) Inventor: Yuki Kajiwara, Cupertino, CA (US)

(73) Assignee: KYOCERA CORPORATION, Kyoto (JP)

( * ) Notice: Subject to any disclaimer, the term of this patent is extended or adjusted under 35 U.S.C. 154(b) by 237 days.

(21) Appl. No.: 14/763,106

(22) PCT Filed: Dec. 21, 2013

(86) PCT No.: PCT/JP2013/084380
§ 371 (c)(1),
(2) Date: Jan. 11, 2016

(87) PCT Pub. No.: WO2014/119177
PCT Pub. Date: Aug. 7, 2014

(30) Foreign Application Priority Data

Jan. 30, 2013 (JP) ................................. 2013-015004

(51) Int. Cl.
*C23C 16/455* (2006.01)
*H01J 37/32* (2006.01)
(Continued)

(52) U.S. Cl.
CPC .. *C23C 16/45563* (2013.01); *C23C 16/45565* (2013.01); *C23C 16/45589* (2013.01);
(Continued)

(58) Field of Classification Search
CPC .. H01J 37/3244; C04B 35/6261; C04B 35/03; C04B 35/62655; C04B 35/62695;
(Continued)

(56) References Cited

U.S. PATENT DOCUMENTS

| | | | | |
|---|---|---|---|---|
| 1,968,348 A * | 7/1934 | Placide | ..................... | B05B 1/02 239/590.5 |
| 3,352,492 A * | 11/1967 | Cape | ..................... | B05B 7/1413 239/85 |
| 3,592,575 A * | 7/1971 | Jaeger | ..................... | F23D 17/00 239/549 |

(Continued)

FOREIGN PATENT DOCUMENTS

| | | |
|---|---|---|
| EP | 0738697 A1 | 10/1996 |
| JP | H09-002864 A | 1/1997 |

(Continued)

OTHER PUBLICATIONS

International Search Report dated Mar. 18, 2014 issued for International Application No. PCT/JP2013-084380.

*Primary Examiner* — Rudy Zervigon
(74) *Attorney, Agent, or Firm* — Procopio, Cory, Hargreaves & Savitch LLP

(57) ABSTRACT

A gas nozzle according to an embodiment of the present invention includes a columnar main body including a ceramic sintered body having a through hole through which gas flows. An outlet of the through hole for the gas is formed on one end face of the main body. An inner wall of the through hole has a first region located in a vicinity of the outlet, and a second region located further inward of the main body than the first region. The first region and the second region each include a sintered surface of the ceramic sintered body. Average crystal grain size in the first region is larger than average crystal grain size in the second region.

8 Claims, 4 Drawing Sheets

(51) Int. Cl.
  *B24B 37/00* (2012.01)
  *B24B 37/04* (2012.01)
  *C04B 35/03* (2006.01)
  *C04B 35/44* (2006.01)
  *C04B 35/443* (2006.01)
  *C04B 35/505* (2006.01)
  *C04B 35/626* (2006.01)
  *C23C 16/44* (2006.01)

(52) U.S. Cl.
  CPC .... H01J 37/3244 (2013.01); H01J 37/32467 (2013.01); H01J 37/32495 (2013.01); *B24B 37/00* (2013.01); *B24B 37/04* (2013.01); *C04B 35/03* (2013.01); *C04B 35/44* (2013.01); *C04B 35/443* (2013.01); *C04B 35/505* (2013.01); *C04B 35/6261* (2013.01); *C04B 35/62645* (2013.01); *C04B 35/62655* (2013.01); *C04B 35/62695* (2013.01); *C04B 2235/9669* (2013.01); *C23C 16/44* (2013.01); *C23C 16/4404* (2013.01); *C23C 16/455* (2013.01)

(58) Field of Classification Search
  CPC . C04B 35/505; C04B 35/62645; C04B 35/44; C04B 35/443; C04B 2235/786; C04B 2235/963; C04B 2235/3208; C04B 2235/3206; C04B 2235/3217; C04B 2235/3418; C04B 2235/5436; C04B 2235/94; C04B 2235/9669; C04B 2235/3244; B24B 37/04; B24B 37/00; C23C 16/45563; C23C 16/4404
  USPC .................................. 118/715; 156/345.1
  See application file for complete search history.

(56) References Cited

U.S. PATENT DOCUMENTS

| | | | | |
|---|---|---|---|---|
| 3,745,969 A * | 7/1973 | Huffman | C23C 16/4584 | 118/730 |
| 3,881,863 A * | 5/1975 | Creuz | F23D 17/00 | 431/347 |
| 3,995,811 A * | 12/1976 | Broderick | B05B 7/206 | 239/567 |
| 4,069,974 A * | 1/1978 | Zawacki | B05B 5/032 | 118/326 |
| 4,080,927 A * | 3/1978 | Brown | G21C 3/626 | 118/716 |
| 4,293,755 A * | 10/1981 | Hill | C23C 16/4411 | 118/50.1 |
| 4,313,721 A * | 2/1982 | Henriques | F23D 11/406 | 239/424.5 |
| 4,389,229 A * | 6/1983 | Jang | B07B 7/02 | 118/692 |
| 4,439,401 A * | 3/1984 | Voll | C09C 1/50 | 239/424.5 |
| 4,481,228 A * | 11/1984 | Morel | B05B 5/04 | 118/626 |
| 4,730,775 A * | 3/1988 | Maas | B05B 1/28 | 239/120 |
| 4,854,263 A * | 8/1989 | Chang | C23C 16/345 | 118/50.1 |
| 5,002,928 A * | 3/1991 | Fukui | B05B 17/0623 | 427/110 |
| 5,105,761 A * | 4/1992 | Charlet | H01J 37/3244 | 118/719 |
| 5,134,965 A * | 8/1992 | Tokuda | C23C 16/45502 | 118/715 |
| 5,169,509 A * | 12/1992 | Latz | C23C 14/0063 | 204/192.13 |
| 5,232,164 A * | 8/1993 | Resch | B05B 1/265 | 239/424 |
| 5,290,993 A * | 3/1994 | Kaji | H01J 37/32192 | 156/345.42 |
| 5,297,738 A * | 3/1994 | Lehr | B05B 1/3442 | 239/493 |
| 5,522,934 A * | 6/1996 | Suzuki | C23C 16/455 | 118/723 AN |
| 5,547,714 A * | 8/1996 | Huck | A61F 2/30767 | 264/317 |
| 5,556,521 A * | 9/1996 | Ghanbari | H01J 37/321 | |
| 5,567,267 A * | 10/1996 | Kazama | H01J 37/32 | 118/724 |
| 5,614,055 A * | 3/1997 | Fairbairn | H01J 37/321 | 118/723 AN |
| 5,643,394 A * | 7/1997 | Maydan | C23C 16/45574 | 118/723 E |
| 5,678,595 A * | 10/1997 | Iwabuchi | F16K 49/002 | 137/341 |
| 5,728,223 A * | 3/1998 | Murakami | C23C 16/455 | 118/715 |
| 5,772,771 A * | 6/1998 | Li | C23C 16/4405 | 118/715 |
| 6,013,155 A * | 1/2000 | McMillin | C23C 16/455 | |
| 6,070,551 A * | 6/2000 | Li | C23C 16/401 | 118/715 |
| 6,083,451 A | 7/2000 | Gupta et al. | | |
| 6,106,663 A * | 8/2000 | Kuthi | H01J 37/32009 | 118/50.1 |
| 6,143,078 A * | 11/2000 | Ishikawa | H01L 21/67017 | 118/715 |
| 6,230,651 B1* | 5/2001 | Ni | H01J 37/3244 | |
| 6,270,862 B1* | 8/2001 | McMillin | C23C 16/455 | 427/569 |
| 6,302,965 B1* | 10/2001 | Umotoy | C23C 16/16 | 118/715 |
| 6,453,992 B1* | 9/2002 | Kim | C23C 16/45565 | 118/666 |
| 6,638,886 B1 | 10/2003 | Gupta et al. | | |
| 6,916,398 B2* | 7/2005 | Chen | C23C 16/34 | 118/715 |
| 7,785,417 B2* | 8/2010 | Ni | H01J 37/3244 | 118/715 |
| 8,025,731 B2* | 9/2011 | Ni | H01J 37/3244 | 118/715 |
| 9,633,822 B2* | 4/2017 | Tanaka | H01J 37/3244 | |
| 2002/0086106 A1* | 7/2002 | Park | C23C 16/403 | 427/248.1 |
| 2002/0088545 A1* | 7/2002 | Lee | C23C 16/45565 | 156/345.33 |
| 2002/0129768 A1* | 9/2002 | Carpenter | C23C 16/45544 | 118/715 |
| 2002/0179247 A1* | 12/2002 | Davis | C23C 16/4405 | 156/345.33 |
| 2003/0000924 A1* | 1/2003 | Strang | C23C 16/45523 | 216/86 |
| 2003/0070620 A1* | 4/2003 | Cooperberg | C23C 16/45574 | 118/723 AN |
| 2003/0141178 A1* | 7/2003 | Shan | G10K 15/06 | 204/157.15 |
| 2005/0092245 A1* | 5/2005 | Moon | C23C 16/45512 | 118/715 |
| 2006/0096540 A1* | 5/2006 | Choi | C23C 16/45574 | 118/724 |
| 2006/0219361 A1* | 10/2006 | Wang | H01J 37/32357 | 156/345.33 |
| 2007/0261639 A1* | 11/2007 | Morioka | C23C 16/45563 | 118/715 |
| 2008/0196666 A1* | 8/2008 | Toshima | C23C 16/45565 | 118/723 E |
| 2014/0283995 A1* | 9/2014 | Tanaka | C04B 35/443 | 156/345.33 |

FOREIGN PATENT DOCUMENTS

| | | |
|---|---|---|
| JP | H11-214365 A | 8/1999 |
| JP | 2000-195807 A | 7/2000 |
| JP | 2001-181042 A | 7/2001 |

(56) References Cited

FOREIGN PATENT DOCUMENTS

| | | |
|---|---|---|
| JP | 2003-181326 A | 7/2003 |
| JP | 2003-340318 A | 12/2003 |
| JP | 2007-063595 A | 3/2007 |
| JP | 2012-054266 A | 3/2012 |
| WO | 2013-065666 A1 | 5/2013 |

* cited by examiner

GAS NOZZLE AND PLASMA DEVICE EMPLOYING SAME

TECHNICAL FIELD

The present invention relates to a gas nozzle employed in a plasma device such as a film forming device or an etching device in, for example, a semiconductor manufacturing process or a liquid crystal manufacturing process, and a plasma device employing the same.

BACKGROUND ART

Conventionally, in a semiconductor manufacturing process or a liquid crystal manufacturing process, a plasma device such as a film forming device for forming a thin film on an object such as a semiconductor wafer or a glass substrate, or an etching device for applying microfabrication to an object is employed. In the film forming device, raw material gas is supplied into a reaction chamber, and this gas chemically reacts.

Accordingly, a thin film is formed on an object. Additionally, in the etching device, halogen type corrosive gas is supplied into a reaction chamber as raw material gas, and this gas is converted into plasma to become etching gas. Accordingly, microfabrication is applied to the object.

As disclosed in Japanese Unexamined Patent Application Publication No. 2000-195807, a plasma device has a gas nozzle for supplying gas into a reaction chamber. This gas nozzle includes a columnar main body including a ceramic sintered body having a through hole through which gas flows.

In a case of employing the plasma device, when a surface of the ceramic sintered body configuring an inner wall of the through hole is exposed to plasma-converted gas in the reaction chamber, the surface is damaged and particles may falloff from this surface. When these particles adhere to the object, failure is likely to occur in the object.

SUMMARY OF THE INVENTION

The present invention provides a gas nozzle responding to a demand for reduction of falling-off of particles.

A gas nozzle according to an embodiment of the present invention includes a columnar main body including a ceramic sintered body having a through hole through which gas flows. An outlet of the through hole for the gas is formed on one end face of the main body. An inner wall of the through hole has a first region located in a vicinity of the outlet, and a second region located further inward of the main body than the first region. The first region and the second region each include a sintered surface of the ceramic sintered body. Average crystal grain size in the first region is larger than average crystal grain size in the second region.

A plasma device according to an embodiment of the present invention includes: a reaction chamber; the above-described gas nozzle out of which the gas flows into the reaction chamber; and a discharge member that converts the gas into plasma by discharge.

According to the gas nozzle according to the embodiment of the present invention, it is possible to increase plasma resistance in the first region that is likely to be exposed to plasma-converted gas, and consequently to reduce falling-off of particles.

PREFERRED EMBODIMENTS FOR CARRYING OUT THE INVENTION

<Gas Nozzle>

Hereinafter, a film forming device 1 employing a gas nozzle according to the one embodiment of the present invention will be described in detail with reference to FIG. 1 and FIG. 2.

Figure 1:
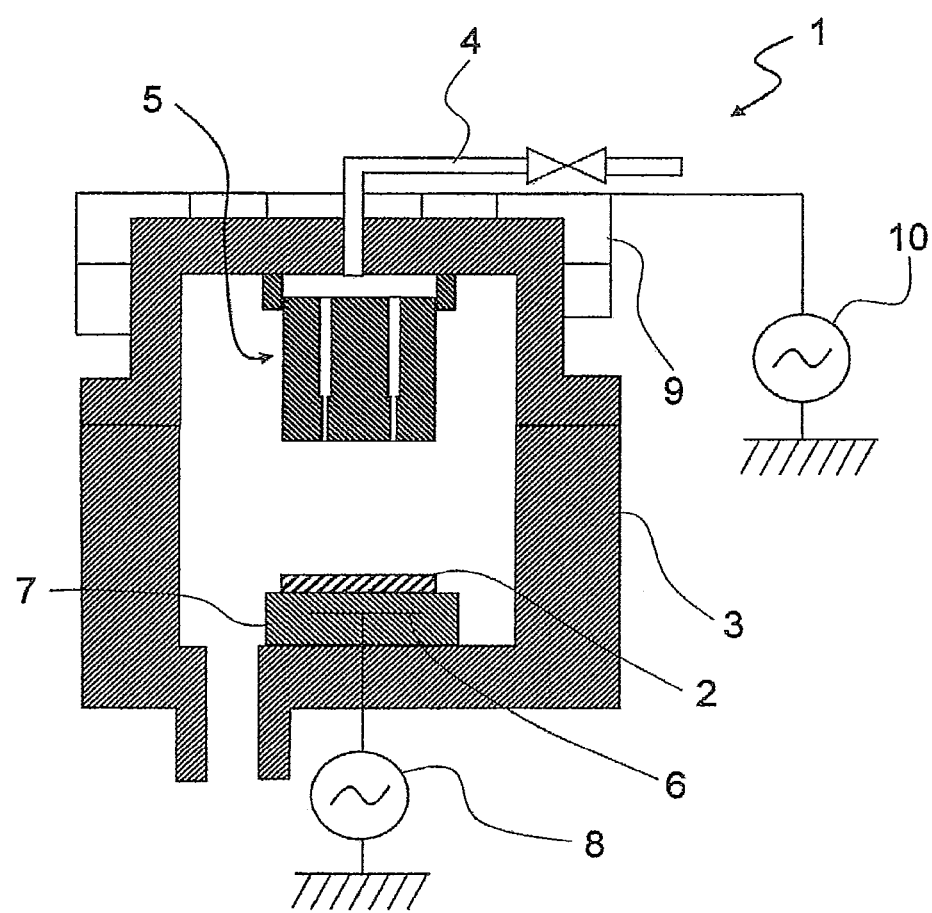
FIG. 1 is a sectional view of a film forming device employing a gas nozzle according to one embodiment of the present invention.

As illustrated in FIG. 1, the film forming device 1 of the one embodiment is a device that forms a thin film on an object 2 such as a semiconductor wafer or a glass substrate by, for example, a plasma CVD method. The film forming device 1 includes a reaction chamber 3 that houses the object 2 and forms a film on the object 2, a gas supply pipe 4 that is external to the reaction chamber 3 and supplies raw material gas to the reaction chamber 3, a gas nozzle 5 that is internal to the reaction chamber 3 and supplies gas from the gas supply pipe 4 into the reaction chamber 3, and a holding member 7 such as an electrostatic chuck on which the object 2 is placed in the reaction chamber 3 and includes an inner electrode 6, a bias supply 8 that is external to the reaction chamber 3 and is electrically connected to the inner electrode 6, and a discharge member that is provided outside the reaction chamber 3 in order to generate plasma in the reaction chamber 3. This discharge member includes a coil 9 and a power supply 10, and performs discharge in the reaction chamber 3 to which raw material gas is supplied. Note that the film forming device 1 may further include a plate member interposed between the gas supply pipe 4 and the gas nozzle 5 and having a flow passage through which gas flows.

This film forming device 1 can form a thin film on the object 2, for example, as follows. Raw material gas is supplied from the gas supply pipe 4 into the reaction chamber 3 through the gas nozzle 5. The gas supplied into the reaction chamber 3 is converted into plasma above the object 2 by discharge of electric power supplied from the coil 9 and the power supply 10. Atoms or molecules of this plasma-converted gas chemically react to deposit on the object 2. Accordingly, a thin film is formed on the object 2. For example, when a silicon oxide ($SiO_2$) thin film is formed on the object 2, silane ($SiH_4$) gas, argon (Ar) gas, oxygen ($O_2$) gas, and the like are supplied to the reaction chamber 3 as the raw material. Note that when unnecessary deposits are cleaned by plasma, nitrogen trifluoride ($NF_3$) gas, octafluoropropane ($C_3F_8$) gas, or the like is supplied to the reaction chamber 3.

Figure 2A:
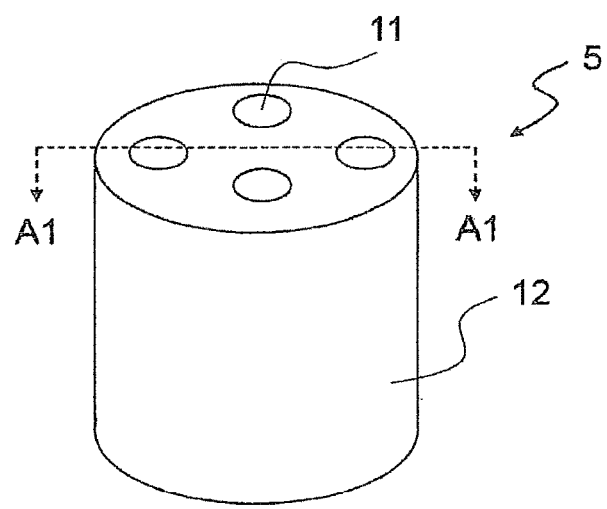
FIG. 2(a) is a perspective view of the gas nozzle illustrated in FIG. 1.
Figure 2B:
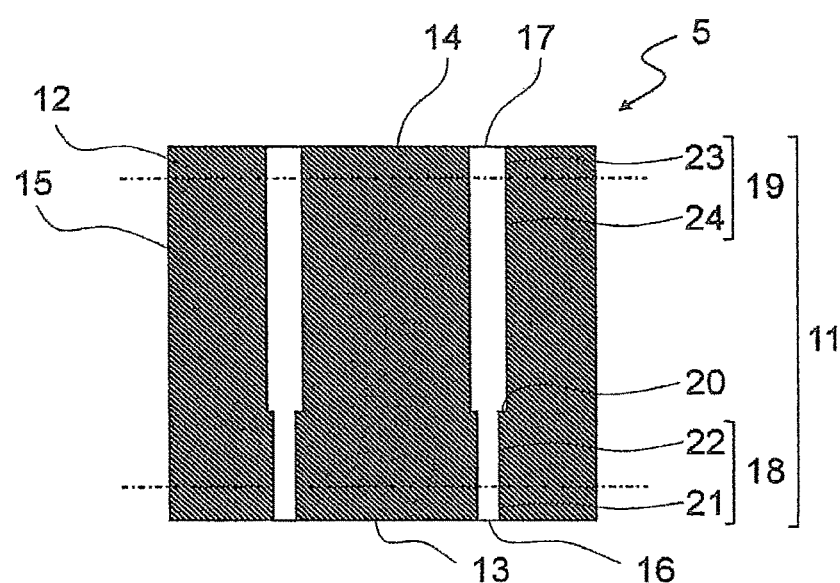
FIG. 2(b) is a sectional view taken along an A1-A1 line of FIG. 2(a).

Next, the gas nozzle 5 of this embodiment will be described in detail. As illustrated in FIGS. 2(a) and 2(b), the gas nozzle 5 has a cylindrical main body 12 including a ceramic sintered body having each through hole 11 through which gas flows. This main body 12 has one end face 13 that is a lower surface, other end face 14 that is an upper surface, and a side face 15 that is located between the one end face 13 and the other end face 14. The diameter (width) of the main body 12 is, for example, 30 mm or more and 100 mm or less. Additionally, the height of the main body 12 is, for example, 30 mm or more and 100 mm or less. Note that the main body 12 only needs to have a columnar shape and, for example, may have a polygonal columnar shape.

Since the main body 12 of the gas nozzle 5 includes the ceramic sintered body, the main body has high plasma resistance. As a result, when the main body 12 is exposed to the plasma-converted gas in the reaction chamber 3, it is possible to reduce generation of particles from the main body 12. Therefore, it is possible to reduce adhesion of particles to the object 2, and it is possible to suppress generation of failure in the object 2.

As the ceramic sintered body of the main body 12, an yttria ($Y_2O_3$) sintered body, an yttrium-aluminum-garnet (YAG) sintered body, for example, a spinel sintered body that is a magnesium aluminate sintered body ($MgAl_2O_4$), or an alumina ($Al_2O_3$) sintered body having alumina purity of 99.5 mass % or more (hereinafter, referred to as a high purity alumina sintered body) is desirably employed. As a result, it is possible to enhance plasma resistance of the ceramic sintered body.

Note that the alumina purity is a content obtained by converting aluminum to an oxide in the alumina sintered body, and can be determined as follows. First, apart of the alumina sintered body is crushed, and the obtained powder is dissolved in solution such as hydrochloric acid. Next, the dissolved solution is subjected to measurement employing an ICP (Inductively Coupled Plasma) emission spectrophotometer (manufactured by SHIMADZU CORPORATION: ICPS-8100 or the like). Accordingly, a metal amount of each obtained component is converted to an oxide, and alumina purity is determined.

In a case where the main body 12 includes the yttria sintered body, the main body 12 has higher plasma resistance than the yttrium-aluminum-garnet sintered body, the spinel sintered body, or the high purity alumina sintered body. Therefore, since it is possible to suppress damage of the main body 12 by the plasma-converted gas, the gas nozzle 5 can be used for over a long period. For example, the yttria sintered body employed in the main body 12 contains, for example, 99 mass % or more and 99.99 mass % or less of yttria as a main component, and contains 0.01 mass % or more and 1 mass % or less of zirconium (Zr) or silicon (Si) as a sintering aid. Note that the content of each component in the yttria sintered body is a content obtained by converting the content of each component to an oxide, and can be determined by employing the ICP emission spectrophotometer in a similar manner to that in the above-described alumina purity.

Additionally, in a case where the main body 12 includes the spinel sintered body, the main body 12 has certain plasma resistance or more, and is excellent in a mechanical characteristic and a thermal characteristic compared to the yttria sintered body. For example, the spinel sintered body employed in the main body 12 contains, for example, 90 mass % or more and 99.9 mass % or less of magnesium aluminate as a main component, and contains 0.1 mass % or more and 10 mass % or less of calcium (Ca), magnesium (Mg) or zirconium as a sintering aid. As a result, it is possible to enhance plasma resistance. Additionally, the content of each component in the spinel sintered body is a content obtained by converting the content of each component to an oxide, and can be determined by employing the ICP emission spectrophotometer in a similar manner to that in the above-described alumina purity.

Additionally, in a case where the main body 12 includes the yttrium-aluminum-garnet sintered body, the main body 12 has certain plasma resistance or more, and is excellent in a mechanical characteristic and a thermal characteristic compared to the yttria sintered body or the spinel sintered body. The YAG sintered body employed in the main body 12 contains, for example, 45 mol % or more and 80 mol % or less of yttria, and contains, for example, 20 mol % or more and 55 mol % or less of alumina. As a result, it is possible to attain an excellent mechanical characteristic, and to enhance plasma resistance. Note that the content of each component included in the yttrium-aluminum-garnet sintered body is a content obtained by converting the content of each component to an oxide, and can be determined by employing the ICP emission spectrophotometer in a similar manner to that in the above-described alumina purity.

The through hole 11 formed in the main body 12 is a flow passage through which gas flows in the gas nozzle 5. This through hole 11 has an outlet 16 which is formed on the one end face 13 and through which gas flows out into the reaction chamber 3, and an inlet 17 which is formed on the other end face 14 and through which gas flows in from the gas supply pipe 4.

Additionally, the through hole 11 has a cylindrical first hole 18 disposed on an outlet 16 side, and a cylindrical second hole 19 disposed on an inlet 17 side. The diameter (width) of the first hole 18 is smaller than the diameter (width) of the second hole 19. The diameter (width) of the first hole 18 is, for example, 0.1 mm or more and 2 mm or less. The height of the first hole 18 is, for example, 1 mm or more and 10 mm or less. The diameter (width) of the second hole 19 is, for example, 1 mm or more and 20 mm or less. The height of the second hole 19 is, for example, 10 mm or more and 100 mm or less. Note that the through hole 11 may include only the first hole 18, or may further have a hole having a diameter different from the diameters of the first hole 18 and the second hole 19. Additionally, each of the first hole 18 and the second hole 19 only needs to have a columnar shape and, for example, may have a polygonal columnar shape. Additionally, the longitudinal directions of the first hole 18 and the second hole 19 may be parallel or may not be parallel to the longitudinal direction of the main body 12.

At a boundary between the first hole 18 and the second hole 19, a stepped part 20 that connects an inner wall of the first hole 18 and an inner wall of the second hole 10 is formed. As a result, even when particles are generated in the inner wall of the second hole 19, the particles are likely to stay in the stepped part 20 and it is possible to suppress outflow of the particles from the outlet 16.

The inner wall of the first hole 18 includes a sintered surface of the ceramic sintered body. The sintered surface is a fired surface that is not processed after the ceramic sintered body is obtained by firing, as described later. The inner wall of this first hole 18 has a first region 21 located in the vicinity of the outlet 16, and a second region 22 located further inward of the main body 12 than the first region 21. The second region 22 of the one embodiment is a region other than the first region 21 in the first hole 18. Note that the fact that the inner wall of the first hole 18 is the sintered surface can be confirmed by observing the inner wall of the first hole 18 with a scanning electron microscope or a metallurgical microscope.

The inner wall of the second hole 19 includes a processed surface such as a ground face or a polished face of the ceramic sintered body. The ground face is a surface that is ground after the ceramic sintered body is obtained by firing. Additionally, the polished face is a surface that is grounded and further polished after the ceramic sintered body is obtained by firing. The inner wall of this second hole 19 has a third region 23 located in the vicinity of the inlet 17, and a fourth region 24 located further inward of the main body 12 than the third region 23. The fourth region 24 of the one embodiment is a region other than the third region 23 in the second hole 19. Note that the fact that the inner wall of the second hole 19 is the processed surface can be confirmed by observing the inner wall of the second hole 19 with a scanning electron microscope or a metallurgical microscope.

Now, when the film forming device 1 is employed, the surface of the ceramic sintered body configuring the inner wall of the through hole 11 may be exposed to plasma-converted gas in the reaction chamber 3.

On the other hand, in the one embodiment, in the inner wall of the through hole 11, the first region 21 and the second region 22 each include the sintered surface. Since this sintered surface is not damaged by processing and is a smooth surface compared to the processed surface, particles are unlikely to fall off when the sintered surface is exposed to the plasma-converted gas. Therefore, it is possible to reduce generation of particles in the first region 21 and the second region 22.

Further, the average crystal grain size in the first region 21 is larger than the average crystal grain size in the second region 22. When the average crystal grain size in the sintered surface of the ceramic sintered body is large, a ratio of an area in the sintered surface of the crystal grain boundary which is likely to be corroded by plasma is reduced. For this reason, when the sintered surface is exposed to the plasma-converted gas, particles are unlikely to fall off. Therefore, since the first region 21 is located in the vicinity of the outlet 16, it is possible to satisfactorily reduce generation of particles in the first region 21 that is likely to be exposed to the plasma-converted gas compared to the second region 22. For that reason, it is possible to reduce adhesion of particles to the object 2 and to suppress generation of failure in the object 2.

Additionally, when the average crystal grain size in the sintered surface of the ceramic sintered body is small, the filling rate of crystal grain in the sintered surface is increased. For this reason, mechanical strength of the sintered surface is increased. Therefore, in the second region 22 that is unlikely to be exposed to the plasma-converted gas compared to the first region 21 because of being located further inward of the main body 12, damage of the main body 12 due to mechanical stress or thermal stress can be suppressed by increasing the mechanical strength while reducing influence by the plasma-converted gas.

The first region 21 is desirably a region separated from the outlet 16 by 5 mm or less. Further, the first region 21 is desirably a region separated from the outlet 16 by 1 mm or less. As a result, while a region that is likely to be exposed to the plasma-converted gas can be made into the first region 21, a region that is unlikely to be exposed to the plasma-converted gas can be made into the second region 22. For this reason, it is possible to suppress damage of the main body 12 due to mechanical stress or thermal stress, while satisfactorily reducing generation of particles.

The average crystal grain size in the first region 21 is desirably 1.5 times or more the average crystal grain size in the second region 22. As a result, it is possible to satisfactorily reduce generation of particles in the first region 21. Further, the average crystal grain size in the first region 21 is desirably 10 times or less the average crystal grain size in the second region 22. The average crystal grain size in the first region 21 is, for example, 3 μm or more and 20 μm or less. Additionally, the average crystal grain size in the second region 22 is, for example, 2 μm or more and 10 μm or less. This average crystal grain size in the first region 21 and this average crystal grain size in the second region 22 can be determined by photographing the surfaces of the first region 21 and second region 22 by employing a metallurgical microscope, and analyzing the photographed image by employing an image analyzer (manufactured by NIRECO CORPORATION: LUZEX-FS).

Additionally, in the through hole 11 of the one embodiment, as described above, the inner wall of the first hole 18 includes the sintered surface, and the inner wall of the second hole 19 includes the processed surface such as the ground face or the polished face. Therefore, since the inner wall of the first hole 18 that is likely to be exposed to the plasma-converted gas because of being closer to the outlet 16 side than the second hole 19 includes the sintered surface, it is possible to satisfactorily reduce generation of particles. On the other hand, since the inner wall of the second hole 19 includes the processed surface, accuracy of the position and the shape can be enhanced by processing, compared to a case where the inner wall includes the sintered surface. Therefore, in the second hole 19 that is unlikely to be exposed to the plasma-converted because of being closer to the inlet 17 side than the first hole 18, it is possible to enhance accuracy of the position and the shape and to suppress leakage of gas due to connection failure of the gas nozzle 5 and the gas supply pipe 4 while reducing influence by the plasma-converted gas.

Particularly, in the second hole 19, since the third region 23 located in the vicinity of the inlet 17 includes the processed face such as the ground face or the polished face, it is possible to satisfactorily suppress leakage of gas due to connection failure of the gas nozzle 5 and the gas supply pipe 4. The third region 20 is desirably a region separated from the inlet 17 by 5 mm or less.

Additionally, the average crystal grain size in the first region 21 is larger than the average crystal grain size in the third region 23. As a result, while the generation of particles can be reduced satisfactorily as described above by increasing the average crystal grain size in the first region 21, damage of the main body 12 due to mechanical stress or thermal stress can be suppressed by reducing the average crystal grain size in the third region 23.

Additionally, the one end face 13 of the main body 12 desirably includes the sintered surface of the ceramic sintered body. As a result, since the one end face 13 that is likely to be exposed to the plasma-converted gas includes the sintered surface, it is possible to satisfactorily reduce the generation of particles. Additionally, the sintered surface is desirably continuously formed from the one end face 13 of the main body 12 to the first region 21 of the through hole 11. As a result, it is possible to satisfactorily reduce the generation of particles. Note that in a case of enhancing accuracy of the shape of the one end face 13, the one end face 13 may be made into the processed surface such as the ground face or the polished face. In this case, from a point of view of falling-off of particles, the one end face 13 is desirably made into the polished face.

Additionally, the other end face 14 of the main body 12 desirably includes the ground face or the polished face of the ceramic sintered body. As a result, it is possible to satisfactorily suppress leakage of gas due to connection failure of the gas nozzle 5 and the gas supply pipe 4.

<Method for Manufacturing Gas Nozzle>

Next, a method for manufacturing the gas nozzle 5 will be described with reference to FIG. 3 and FIG. 4.

Figure 3:
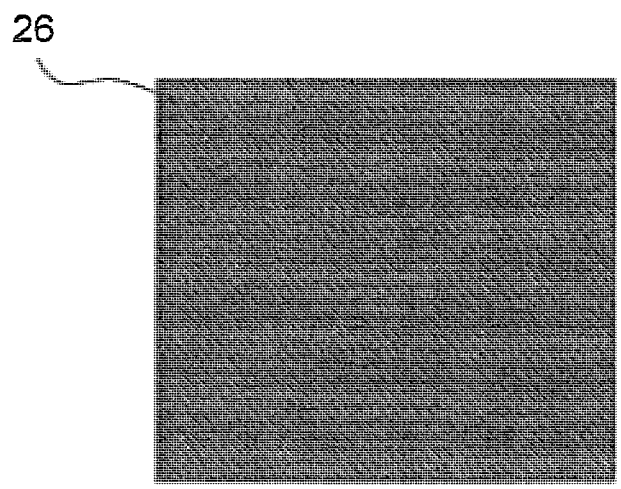
FIGS. 3(a) and 3(b) each are a sectional view of a part corresponding to FIG. 2(b), illustrating a process of manufacturing the gas nozzle illustrated in FIG. 1.
Figure 3:
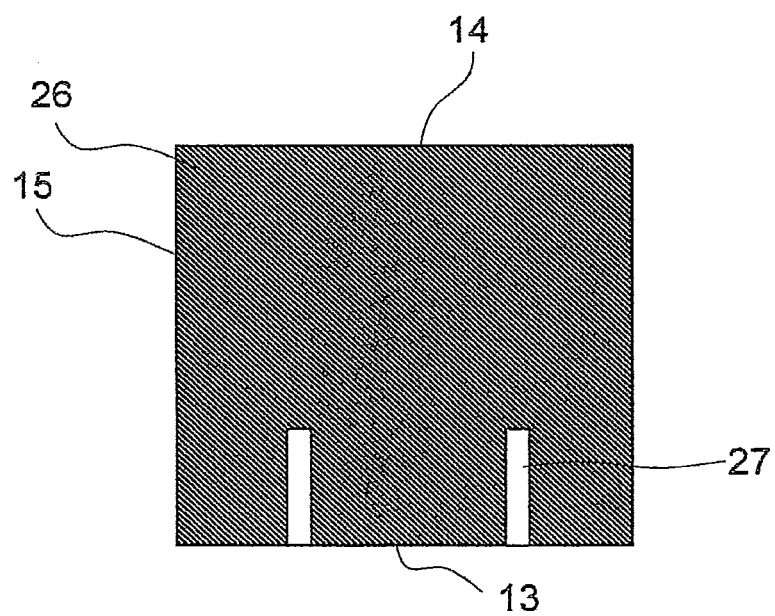

(1) First, as illustrated in FIG. 3 and FIG. 4, a sintered body for main body 25 that is a ceramic sintered body of the above-described main body 12 without the through hole 11 formed therein is made. Specifically, for example, the sintered body for main body is made as follows.

Figure 4A:
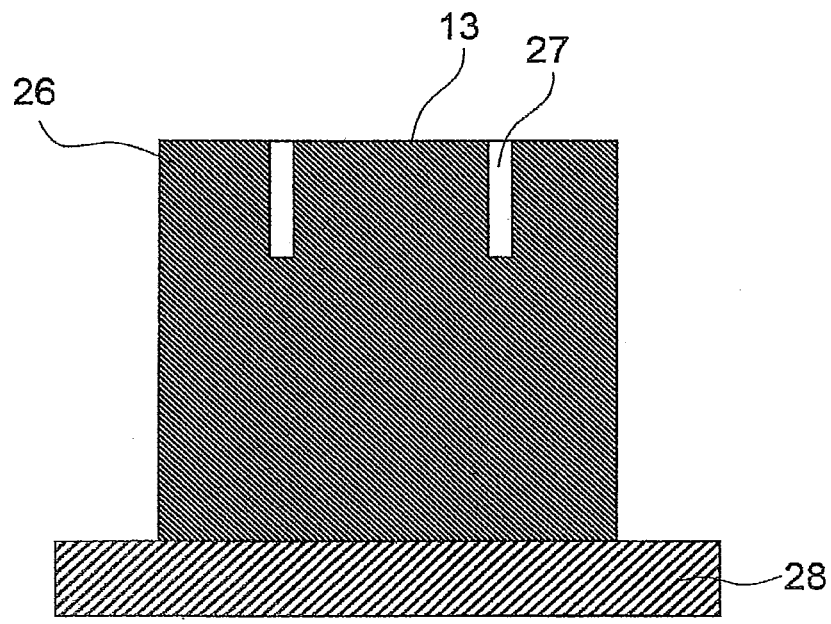
FIGS. 4(a) and 4(b) each are a sectional view of a part corresponding to FIG. 2(b), illustrating a process of manufacturing the gas nozzle illustrated in FIG. 1.
Figure 4B:
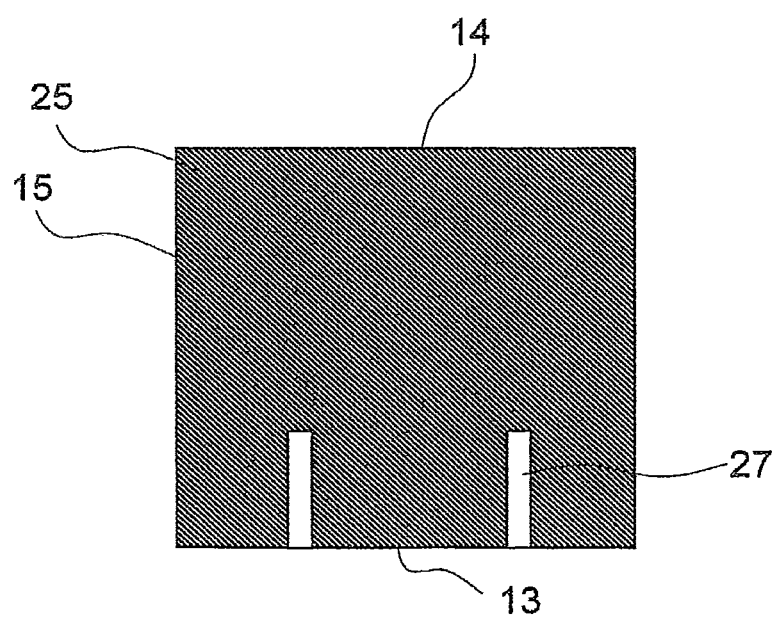

First, pure water and an organic binder are added to ceramic powder, and thereafter subjected to wet blending with a ball mill to make slurry. Next, the slurry is granulated by spray-dry, and ceramic powder is formed. Next, the ceramic powder is molded in a predetermined shape by employing a molding method such as a metallic mold pressing method and a cold isostatic press molding method (CIP molding method), and the cylindrical molded body 26 illustrated in FIG. 3(a) is obtained. Next, as illustrated in FIG. 3(b), each recess 27 that opens on the one end face 13 and becomes the above-described first hole 18 is formed in the molded body 26 by cutting. Next, as illustrated in FIG. 4(a), firing is performed in either atmosphere or oxygen atmosphere, for example, at a temperature of 1400° C. or more and 2000° C. or less. In this manner, it is possible to obtain the sintered body for main body 25 illustrated in FIG. 4(b). In this sintered body for main body 25, the surfaces such as the one end face 13, the other end face 14, the side face 15, and the inner wall of the recess 27 are not processed after the firing, and are the sintered surfaces.

In the one embodiment, as illustrated in FIG. 4(a), the firing of the molded body 26 is performed in a state where the molded body 26 is placed on a placing stand 28 of a firing furnace while the one end face 13 on which the recess 27 opens is exposed as an upper side. As a result, when the molded body 26 is fired, heat is applied from above the molded body 26. For this reason, in the inner wall of the recess 27, large heat is likely to be applied to the first region 21 located in the vicinity of the one end face 13, compared to the second region 22 located further inward of the molded body 26 than the first region 21.

Here, in a case of forming the yttria sintered body, the yttrium-aluminum-garnet sintered body, the spinel sintered body, or the high purity alumina sintered body as the sintered body for main body 25, liquid phase sintering occurs when the molded body 26 is fired. For this reason, crystals of the first region 21 to which larger heat is applied compared to the second region 22 are likely to grow more than those of the second region 22. As a result, in the inner wall of the recess 27 of the sintered body for main body 25, the average crystal grain size in the first region 21 can be made larger than the average crystal grain size in the second region 22.

Particularly, in a case of forming the small first hole 18 having a diameter of 0.1 mm or more and 2 mm or less, the diameter of the recess 27 that becomes the first hole 18 also needs to be reduced. For this reason, air is unlikely to flow inside the recess 27. Therefore, when the molded body 26 is fired, heat is likely to be ununiformly applied to the inner wall of the recess 27, and the heat applied to the first region 21 is likely to become larger than the heat applied to the second region 22. For this reason, in the inner wall of the recess 27 of the sintered body for main body 25, the average crystal grain size in the first region 21 can be easily made larger than the average crystal grain size in the second region 22.

Additionally, the recess 27 has a bottom face at an end on a side opposite to the one end face 13, and does not penetrate the main body 12. As a result, air is unlikely to flow inside the recess 27. Therefore, in the inner wall of the recess 27 of the sintered body for main body 25, the average crystal grain size in the first region 21 can be easily made larger than the average crystal grain size in the second region 22.

Additionally, as a molding method used for forming the molded body 26, the CIP molding method can be desirably employed. According to the CIP molding method, since pressure at the time of molding is uniformly applied, the density of the molded body 26 can be made uniform. Therefore, when the molded body 26 is fired, crystal grains uniformly grow in accordance with an applied temperature. For this reason, as described above, the average crystal grain size in the first region 21 can be easily made larger than the average crystal grain size in the second region 22 by applying larger heat to the first region 21 compared to the second region 22.

(2) The sintered body for main body 25 in which the through hole 11 is formed is used as the main body 12 to make the gas nozzle 5 illustrated in the FIG. 2. Specifically, for example, the gas nozzle is made as follows.

Hole processing is performed from an other end face 14 side of the sintered body for main body 25 by employing grinding processing, and the second hole 19 that opens on the other end face 14 and is connected to the recess 27 is formed in the sintered body for main body 25. Accordingly, the recess 27 becomes the first hole 18, and the through hole 11 including the first hole 18 and the second hole 19 can be formed. Additionally, the other end face 14 is grounded by employing grinding processing to be made into the ground face. As a result, the sintered body for main body 25 can be made into the main body 12. Note that ultrasonic processing may be employed as grinding processing.

In this process, processing such as grinding processing and polishing processing is not performed on the inner wall of the first hole 18 including the recess 27 of the sintered body for main body 25. As a result, it is also possible to maintain the average crystal grain size in the first region 21 and the second region 22 in the inner wall of the first hole 18 of the sintered body for main body 25, while making the inner wall of the first hole 18 into the sintered surface. Therefore, the average crystal grain size in the first region 21 can be made larger than the average crystal grain size in the second region 22.

Additionally, in this process, the one end face 13 can be made into the sintered surface without performing processing such as grinding processing or polishing processing on the one end face 13. In this case, the sintered surface is continuously formed from the one end face 13 of the main body 12 to the first region 21 of the through hole 11. Note that in a case of enhancing accuracy of the shape of the one end face 13, processing such as grinding processing or polishing processing may be performed on the one end face 13. In this case, a processing amount along the longitudinal direction of the sintered body for main body 25 is desirably, for example, 0.5 mm or more and 2 mm or less. As a result, the first region 21 can be left in the main body 12.

Additionally, since the second hole 19 is formed by grinding processing, the inner wall of the second hole 19 becomes the ground face. Note that the inner wall of the second hole 19 can be made into be the polished face by forming the second hole 19 by employing grinding processing and thereafter polishing the inner wall of the second hole 19. Additionally, the other end face 14 can be made into the polished face by making the other end face 14 into the ground face by employing grinding processing and thereafter polishing the other end face 14.

In this manner, the gas nozzle 5 illustrated in FIG. 2 can be obtained.

The present invention is not limited to the above-described embodiment, and various changes, modifications, combinations, and the like can be made without departing from the spirit of the present invention.

For example, although the configuration of employing the gas nozzle in the film forming device is described in the above-described embodiment, the gas nozzle may be employed in other semiconductor manufacturing device or a liquid crystal manufacturing device, and may be employed in, for example, an etching device.

REFERENCE SIGNS LIST

1 Film forming device
2 Object
3 Reaction chamber
4 Gas supply pipe
5 Gas nozzle
6 Inner electrode
7 Holding member
8 Bias supply
9 Coil
10 Power supply
11 Through hole
12 Main body
13 One end face
14 Other end face
15 Side face
16 Outlet
17 Inlet
18 First hole
19 Second hole
20 Stepped part
21 First region
22 Second region
23 Third region
24 Fourth region
25 Sintered body for main body
26 Molded body
27 Recess
28 Placing stand

The invention claimed is:

1. A gas nozzle comprising a columnar main body including a ceramic sintered body having a through hole through which gas flows, wherein
an outlet of the through hole for the gas is formed on one end face of the main body,
an inner wall of the through hole has a first region located in a vicinity of the outlet, and a second region located further inward of the main body than the first region,
the first region and the second region each include a sintered surface of the ceramic sintered body, and
average crystal grain size in the first region is larger than average crystal grain size in the second region.

2. The gas nozzle according to claim 1, wherein the ceramic sintered body includes an yttria sintered body, an yttrium-aluminum-garnet sintered body, a spinel sintered body, or an alumina sintered body having alumina purity of 99.5 mass % or more.

3. The gas nozzle according to claim 1, wherein the first region is a region separated from the outlet by 5 μm or less.

4. The gas nozzle according to claim 1, wherein the average crystal grain size in the first region is 1.5 times or more and 10 times or less the average crystal grain size in the second region.

5. The gas nozzle according to claim 1, wherein the one end face of the main body includes a sintered surface of the ceramic sintered body.

6. The gas nozzle according to claim 1, wherein an inlet of the through hole for the gas is formed on another end face of the main body, the inner wall of the through hole has a third region located in a vicinity of the inlet, the third region includes a ground surface or a polished surface of the ceramic sintered body, and the average crystal grain size in the first region is larger than average crystal grain size in the third region.

7. The gas nozzle according to claim 6, wherein the other end face of the main body includes the ground surface or the polished surface of the ceramic sintered body.

8. A plasma device comprising:
a reaction chamber;
the gas nozzle according to claim 1 out of which the gas flows into the reaction chamber; and
a discharge member that converts the gas into plasma by discharge.

* * * * *